(12) United States Patent
Wang et al.

(10) Patent No.: US 8,400,825 B2
(45) Date of Patent: Mar. 19, 2013

(54) MAGNETIC FIELD ASSISTED STRAM CELLS

(75) Inventors: Xiaobin Wang, Chanhassen, MN (US); Haiwen Xi, Prior Lake, MN (US); Hongyue Liu, Maple Grove, MN (US); Insik Jin, Eagan, MN (US); Andreas Roelofs, Eden Prairie, MN (US); Eileen Yan, Edina, MN (US); Dimitar V. Dimitrov, Edina, MN (US)

(73) Assignee: Seagate Technologies LLC, Scotts Valley, CA (US)

( * ) Notice: Subject to any disclaimer, the term of this patent is extended or adjusted under 35 U.S.C. 154(b) by 0 days.

(21) Appl. No.: 13/491,891

(22) Filed: Jun. 8, 2012

(65) Prior Publication Data

US 2012/0250405 A1    Oct. 4, 2012

Related U.S. Application Data

(63) Continuation of application No. 12/199,126, filed on Aug. 27, 2008, now Pat. No. 8,223,532.

(60) Provisional application No. 61/086,871, filed on Aug. 7, 2008.

(51) Int. Cl.
*G11C 11/00* (2006.01)
(52) U.S. Cl. .................. 365/158; 365/171
(58) Field of Classification Search .................. 365/158, 365/171
See application file for complete search history.

(56) References Cited

U.S. PATENT DOCUMENTS

| | | | |
|---|---|---|---|
| 5,461,526 A | 10/1995 | Hamakawa |
| 5,841,692 A | 11/1998 | Gallagher |
| 5,963,472 A | 10/1999 | Inada |
| 6,166,948 A | 12/2000 | Parkin |
| 6,183,859 B1 | 2/2001 | Chen |
| 6,522,573 B2 | 2/2003 | Saito |
| 6,597,618 B2 | 7/2003 | Zheng |
| 6,605,772 B2 | 8/2003 | Harman |
| 6,633,498 B1 | 10/2003 | Engel |
| 6,714,444 B2 | 3/2004 | Huai |
| 6,771,534 B2 | 8/2004 | Stipe |
| 6,781,874 B2 | 8/2004 | Hidaka |
| 6,791,865 B2 | 9/2004 | Tran |
| 6,819,586 B1 | 11/2004 | Anthony |
| 6,829,161 B2 | 12/2004 | Huai |
| 6,838,740 B2 | 1/2005 | Huai |
| 6,845,038 B1 | 1/2005 | Shukh |
| 6,847,547 B2 | 1/2005 | Albert |
| 6,888,742 B1 | 5/2005 | Nguyen |

(Continued)

FOREIGN PATENT DOCUMENTS

WO    WO 2008/154519    12/2008

OTHER PUBLICATIONS

Berger, L., Emission of Spin waves by a magnetic multilayer traversed by a current, Physical Review B, 1, Oct. 1996, pp. 9353-9358, vol. 54, No. 13, The American Physical Society, USA.

(Continued)

*Primary Examiner* — Jason Lappas
(74) *Attorney, Agent, or Firm* — Mueting Raasch & Gebhardt PA

(57) ABSTRACT

Memory units that have a magnetic tunnel junction cell that utilizes spin torque and a current induced magnetic field to assist in the switching of the magnetization orientation of the free layer of the magnetic tunnel junction cell. The memory unit includes a spin torque current source for passing a current through the magnetic tunnel junction cell, the spin torque current source having a direction perpendicular to the magnetization orientations, and also includes a magnetic ampere field current source is oriented in a direction orthogonal or at some angles to the magnetization orientations.

20 Claims, 7 Drawing Sheets

U.S. PATENT DOCUMENTS

| | | |
|---|---|---|
| 6,903,400 B2 | 6/2005 | Kikuchi |
| 6,933,155 B2 | 8/2005 | Albert |
| 6,950,335 B2 | 9/2005 | Dieny |
| 6,958,927 B1 | 10/2005 | Nguyen |
| 6,963,098 B2 | 11/2005 | Daughton |
| 6,967,863 B2 | 11/2005 | Huai |
| 6,980,464 B2 | 12/2005 | Fukuzumi |
| 6,980,469 B2 | 12/2005 | Kent |
| 6,985,385 B2 | 1/2006 | Nguyen |
| 6,992,359 B2 | 1/2006 | Nguyen |
| 7,006,336 B2 | 2/2006 | Coffey |
| 7,020,009 B2 | 3/2006 | Ho |
| 7,031,178 B2 | 4/2006 | Parkin |
| 7,057,921 B2 | 6/2006 | Valet |
| 7,088,609 B2 | 8/2006 | Valet |
| 7,098,494 B2 | 8/2006 | Pakala |
| 7,110,287 B2 | 9/2006 | Huai |
| 7,126,202 B2 | 10/2006 | Huai |
| 7,160,770 B2 | 1/2007 | Sasaki |
| 7,161,829 B2 | 1/2007 | Huai |
| 7,170,778 B2 | 1/2007 | Kent |
| 7,180,113 B2 | 2/2007 | Braun |
| 7,180,770 B2 | 2/2007 | Perner |
| 7,187,577 B1 | 3/2007 | Wang |
| 7,190,611 B2 | 3/2007 | Nguyen |
| 7,205,564 B2 | 4/2007 | Kajiyama |
| 7,224,601 B2 | 5/2007 | Panchula |
| 7,227,773 B1 | 6/2007 | Nguyen |
| 7,230,265 B2 | 6/2007 | Kaiser |
| 7,230,845 B1 | 6/2007 | Wang |
| 7,233,039 B2 | 6/2007 | Huai |
| 7,241,631 B2 | 7/2007 | Huai |
| 7,242,045 B2 | 7/2007 | Nguyen |
| 7,242,048 B2 | 7/2007 | Huai |
| 7,245,462 B2 | 7/2007 | Huai |
| 7,252,852 B1 | 8/2007 | Parkin |
| 7,272,034 B1 | 9/2007 | Chen |
| 7,272,035 B1 | 9/2007 | Chen |
| 7,274,057 B2 | 9/2007 | Worledge |
| 7,282,755 B2 | 10/2007 | Pakala |
| 7,286,395 B2 | 10/2007 | Chen |
| 7,289,356 B2 | 10/2007 | Diao |
| 7,307,876 B2 | 12/2007 | Kent |
| 7,310,265 B2 | 12/2007 | Zheng |
| 7,339,817 B2 | 3/2008 | Nickel |
| 7,342,169 B2 | 3/2008 | Venkatasubramanian |
| 7,345,911 B2 | 3/2008 | Min |
| 7,345,912 B2 | 3/2008 | Luo |
| 7,349,243 B2 | 3/2008 | Lin |
| 7,369,427 B2 | 5/2008 | Diao |
| 7,372,116 B2 | 5/2008 | Fullerton |
| 7,379,327 B2 | 5/2008 | Chen |
| 7,411,817 B2 | 8/2008 | Nozieres |
| 7,430,135 B2 | 9/2008 | Huai |
| 7,453,720 B2 | 11/2008 | Ju |
| 7,479,193 B1 | 1/2009 | Clark |
| 7,486,545 B2 | 2/2009 | Min |
| 7,486,551 B1 | 2/2009 | Li |
| 7,486,552 B2 | 2/2009 | Apalkov |
| 7,489,541 B2 | 2/2009 | Pakala |
| 7,502,249 B1 | 3/2009 | Ding |
| 7,508,702 B2 | 3/2009 | Ho |
| 7,515,457 B2 | 4/2009 | Chen |
| 7,518,835 B2 | 4/2009 | Huai |
| 7,525,862 B1 | 4/2009 | Sun |
| 7,532,506 B2 | 5/2009 | Dittrich |
| 7,576,956 B2 | 8/2009 | Huai |
| 7,660,151 B2 | 2/2010 | Leuscher |
| 7,746,687 B2 | 6/2010 | Zheng |
| 7,800,095 B2 | 9/2010 | An |
| 7,804,709 B2 | 9/2010 | Wang |
| 8,004,883 B2 | 8/2011 | Zheng |
| 2002/0186582 A1* | 12/2002 | Sharma et al. ............ 365/158 |
| 2004/0084702 A1* | 5/2004 | Jeong ........................ 257/295 |
| 2004/0105326 A1* | 6/2004 | Matsuoka et al. ......... 365/200 |
| 2004/0188733 A1 | 9/2004 | Asao |
| 2004/0233760 A1 | 11/2004 | Guo |
| 2005/0018475 A1 | 1/2005 | Tran |
| 2005/0104146 A1 | 5/2005 | Nickel |
| 2005/0150535 A1 | 7/2005 | Samavedam |
| 2005/0150537 A1 | 7/2005 | Ghoshal |
| 2005/0213375 A1 | 9/2005 | Perner |
| 2006/0215444 A1 | 9/2006 | Perner |
| 2007/0034919 A1 | 2/2007 | Wang |
| 2007/0085068 A1 | 4/2007 | Apalkov |
| 2007/0165449 A1 | 7/2007 | Zheng |
| 2007/0176251 A1* | 8/2007 | Oh et al. .................... 257/421 |
| 2007/0258281 A1 | 11/2007 | Ito |
| 2008/0019040 A1 | 1/2008 | Zhu |
| 2008/0037179 A1 | 2/2008 | Ito |
| 2008/0055792 A1 | 3/2008 | Zheng |
| 2008/0112094 A1 | 5/2008 | Kent |
| 2008/0137224 A1 | 6/2008 | Gao |
| 2008/0154519 A1 | 6/2008 | Zhou |
| 2008/0180827 A1 | 7/2008 | Zhu |
| 2008/0186758 A1 | 8/2008 | Shen |
| 2008/0225584 A1 | 9/2008 | Gao |
| 2008/0273380 A1 | 11/2008 | Diao |
| 2008/0291720 A1 | 11/2008 | Wang |
| 2008/0291721 A1 | 11/2008 | Apalkov |
| 2008/0310213 A1 | 12/2008 | Chen |
| 2008/0310219 A1 | 12/2008 | Chen |
| 2009/0010040 A1 | 1/2009 | Takase |
| 2009/0040855 A1 | 2/2009 | Luo |
| 2009/0050991 A1 | 2/2009 | Nagai |
| 2009/0073750 A1 | 3/2009 | Leuschner |
| 2009/0185410 A1 | 7/2009 | Huai |
| 2009/0302403 A1 | 12/2009 | Nguyen |
| 2010/0034008 A1 | 2/2010 | Wang |
| 2010/0109108 A1 | 5/2010 | Zheng |

OTHER PUBLICATIONS

Florez, S.H. et al., Modification of Critical Spin Torque Current Induced by rf Excitation, Journal of Applied Physics, 103, 07a708 (2008).

Han et al., Current-Induced Butterfly Shaped Domains and Magnetization Switching in Magnetic Tunnel Junctions, Science and Technology of Advanced Materials 6 (2005) 784-788.

Hosomi et al., A Novel Nonvolatile Memory with Spin Torque Transfer Magnetization Switching: Spin-RAM, 2005 IEEE.

Johnson, M.T., et al., Magnetic anisotropy in metallic multilayers, Rep. Prog. Phys., 1996, pp. 1409-1458, vol. 59, IOP Publishing Ltd., UK.

Kawahara et al., 2Mb Spin-Transfer Torque RAM (SPRAM) with Bit-by-bit Bidirectional Current Write and Parallelizing Direction Current Read, ISSC 2007/Session 26/Non-Volatile Memories/26.5.

Kim, Chris H., et al. Dynamic Vt SRAM: A Leakage Tolerant Cache Memory for Low Voltage Microprocessors, ISLPED '02, Aug. 2002, pp. 251-254, US.

Meng et al., Spin Transfer in Nanomagnetic Devices with Perpendicular Anistropy, Applied Physics Letters 88, 172506 (2006).

Ozatay et al., "Sidewall oxide effects on spin-torque- and magnetic-field-induced reversal characteristics of thin-film nanomagnets", Nature Materials, vol. 7, pp. 567-573 (Jul. 2008).

Prejbeanu et al., "Thermally Assisted MRAM", J. Phys. Condens. Matter 19 (2007) 165218 (23 pp).

Rivkin, K. et al., Magnetization Reversal in the Anisotropy-Dominated Regine Using Time-Dependent Magnetic Fileds, Applied Physics Letters 89, 252507 (2006).

Seki et al., Spin-Polarized Current-Induced Magnetization Reversal in Perpendicularly Magnetized L1o-FePt Layers, Applied Physics Letters 88, 172504 (2006).

Slonczewski et al., Conductance and Exchange Coupling of Two Ferromagnets Separated by a Tunneling Barrier, 1989 the American Physical Society, Physical Review B, vol. 39, No. 10, Apr. 1, 1989.

Slonczewski et al., Current-Driven Excitation of Magnetic Multilayers, Journal of Magnetism and Magnetic Materials 159 (1996) L1-L7.

Sun, Spin-Current Interaction with Monodomain Magnetic Body: A Model Study, Physical Review B, vol. 62, No. 1, Jul. 2000.

Thiele et al., FeRh//FePt Exchange Spring Films for Thermally Assisted Magnetic Recording Media, Applied Physics Letters, vol. 82, No. 17, Apr. 2003, p. 2859-2861.

Thiele et al., "Magnetic and Structural Properties of FePt-FeRh Exchange Spring Films for Thermally Assisted Magnetic Recording Media", IEEE Trans. Magnetics, vol. 40, Jul. 2004, p. 2537-2542.

Thiele et al., Spin Dynamics of the Anitferromagnetic-to-Ferromagnetic Phase Transition in FeRh on a Sub-Picosecind Time Scale, Applied Physics Letters, vol. 85, No. 14, Oct. 2004, p. 2857-2859.

Yagami, Kojiro, et al., Inspection of Intrinsic Critical Currents for Spin-Transfer Magnetization Switching, IEEE Transactions on Magnetics, Oct. 2005, pp. 2615-2617, vol. 41, No. 10.

Zhang, L., et al., Heat-assisted magnetic probe recording on a granular CoNi/Pt multilayered film, Journal of Physics D: Applied Physics, 2006, pp. 2485-2487, vol. 39, IOP Publishing Ltd., UK.

U.S. Appl. No. 12/106,363, filed Apr. 21, 2008, Inventors: Xi et al.
U.S. Appl. No. 12/125,975, filed May 23, 2008, Inventors: Xi et al.
U.S. Appl. No. 12/239,887, filed Sep. 29, 2008, Inventors: Zheng et al.
U.S. Appl. No. 12/242,254, filed Sep. 30, 2008, Inventors: Zheng et al.
U.S. Appl. No. 12/248,237, filed Oct. 9, 2008, Inventor: Zhu.
U.S. Appl. No. 12/389,422, filed Feb. 20, 2009, Inventors: Ahn et al.
U.S. Appl. No. 12/396,868, filed Mar. 3, 2009; Inventors: Zheng.
U.S. Appl. No. 12/425,457, filed Apr. 17, 2009, Inventors: Gao et al.
U.S. Appl. No. 12/425,466, filed Apr. 17, 2009, Inventors: Lou et al.

Zheng, et al., Multilevel Magnetic Resistive Random Access Memory Written at Curie Point, Intermag Europe 2002, BB-02.

Zheng, Y. et al., Magnetic Random Access Memory (MRAM), J. Nano. Sci. Nano Tec. 7, 177-137 (2007).

* cited by examiner

MAGNETIC FIELD ASSISTED STRAM CELLS

RELATED APPLICATIONS

This application is a continuation of U.S. application Ser. No. 12/199,126, filed Aug. 27, 2008 and claims priority to U.S. provisional patent application No. 61/086,871, filed on Aug. 7, 2008. The entire disclosures of these applications are incorporated herein by reference.

BACKGROUND

Spin torque transfer technology, also referred to as spin electronics, combines semiconductor technology and magnetics, and is a more recent development. In spin electronics, the spin of an electron, rather than the charge, is used to indicate the presence of digital information. The digital information or data, represented as a "0" or "1", is storable in the alignment of magnetic moments within a magnetic element. The resistance of the magnetic element depends on the moment's alignment or orientation. The stored state is read from the element by detecting the component's resistive state.

The magnetic element, in general, includes a ferromagnetic pinned layer and a ferromagnetic free layer, each having a magnetization orientation, and a non-magnetic barrier layer therebetween. The magnetization orientations of the free layer and the pinned layer define the resistance of the overall magnetic element. Such an element is generally referred to as a "spin tunneling junction," "magnetic tunnel junction", "magnetic tunnel junction cell", and the like. When the magnetization orientations of the free layer and pinned layer are parallel, the resistance of the element is low. When the magnetization orientations of the free layer and the pinned layer are antiparallel, the resistance of the element is high.

At least because of their small size, it is desirous to use magnetic tunnel junction cell elements in many applications, such as random access memory. However, their small size also creates issues.

One problem in spin torque magnetic random memory (STRAM) is maintaining thermal stability of the magnetic elements at room temperature while at the same time switching each of the multitudes of cells in the acceptable current amplitude range. Due to the distribution of the switching current, the ability to switch every single memory cell using a current with the amplitude in the acceptable range is an issue. It is desired to reduce the switching current needed in order to inhibit thermal instability of the cells.

The present disclosure provides spin torque memory (STRAM) switching schemes that implement magnetic fields to reduce the switching current of the STRAM cell.

BRIEF SUMMARY

The present disclosure relates to magnetic tunnel junction cells that utilize spin torque and a current induced magnetic field to assist in the switching of the magnetization orientation of the free layer of the magnetic tunnel junction cell. The magnetic memory unit, which includes the magnetic tunnel junction cell and the current source, can be utilized in a memory array.

In one particular embodiment, this disclosure describes a memory unit having a magnetic tunnel junction cell comprising a ferromagnetic pinned layer, a ferromagnetic free layer, and a non-magnetic barrier layer therebetween, the pinned layer and the free layer each having a magnetization orientation. The memory unit includes a spin torque current source for passing a current through the magnetic tunnel junction cell, the spin torque current source having a direction perpendicular to the magnetization orientations, and also includes a magnetic ampere field current source is oriented in a direction orthogonal to the magnetization orientations. The magnetic ampere field current source may be positioned above or below the magnetic tunnel junction cell or may be positioned generally planar with the cell.

In another particular embodiment, this disclosure describes a memory unit having a magnetic tunnel junction cell comprising a ferromagnetic pinned layer, a ferromagnetic free layer, and a non-magnetic barrier layer therebetween, the pinned layer and the free layer each having a magnetization orientation. The memory unit includes a spin torque current source providing a first current to orient the free layer magnetization via spin torque in a first direction and a magnetic ampere field current source providing a second current to orient the free layer magnetization in the first direction via a magnetic ampere field. This magnetic ampere field current source may be at an angle other than orthogonal to the magnetization orientation direction, for example, at an angle between 0 and 90 degrees (exclusive of 0 degrees and 90 degrees) to the magnetization orientation.

In yet another particular embodiment, this disclosure describes a method for switching a magnetization orientation of a free layer of a magnetic tunnel junction cell. The method includes providing a spin torque current pulse from a first current source to orient the magnetization of a free layer of a tunnel junction cell in a first direction, and providing a magnetic ampere field current pulse proximate the magnetic tunnel junction cell from a second current source to orient the magnetization of the free layer in the first direction. The magnetic ampere field current pulse may be from a source that is orthogonal to the free layer magnetization orientation direction or that is at an angle other than orthogonal to the magnetization orientation direction.

Additional embodiments of magnetic tunnel junction cells and memory units are disclosed, as well as memory arrays including the units, and methods of making and using the cells. These and various other features and advantages will be apparent from a reading of the following detailed description.

BRIEF DESCRIPTION OF THE DRAWINGS

The disclosure may be more completely understood in consideration of the following detailed description of various embodiments of the disclosure in connection with the accompanying drawings, in which.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

Figure 1A:
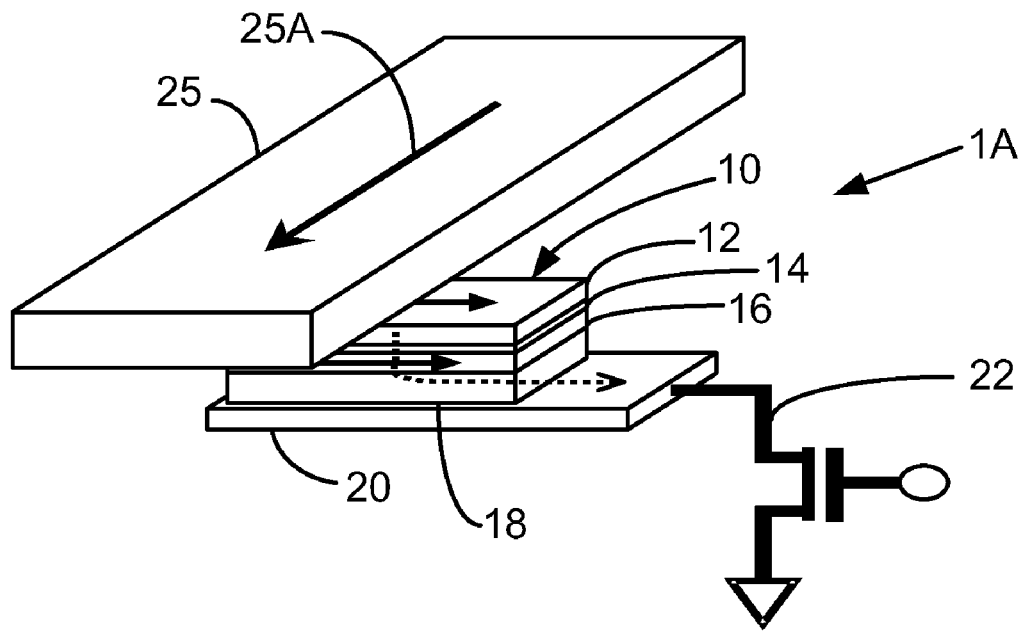
FIG. 1A is a schematic perspective view of a first embodiment of a magnetic memory unit having a magnetic tunnel junction cell with a current applied to the magnetic tunnel junction cell proximate the free layer, the current applied generally orthogonal to the free layer magnetization orientation direction.

This disclosure is directed to spin-transfer torque memory, also referred to as spin torque memory, spin torque RAM, or STRAM, and the magnetic tunnel junction cells (MTJs) that are a part of the memory. The spin magnetic tunnel junction cells (MTJs) of this disclosure utilize a current generated magnetic field to assist in the switching of the magnetization orientation of the free layer of the magnetic tunnel junction cell. Since both spin torque and magnetic field have an effect on the free layer magnetization, the total switching current can be reduced.

In the magnetic tunnel junction cells and memory units of this disclosure, and in the memory that incorporates those cells and units, spin torque rotates the free layer magnetization out of its initial equilibrium state as it is confined by an energy barrier defined by the magnetic properties of the tunneling stack. In accordance with this disclosure, an external magnetic field, created by the ampere field of a second, proximate, current, is added to facilitate orientation of the free layer magnetization. The addition of this external magnetic field to the magnetic tunnel junction cell has several effects on affecting the free layer magnetization. The magnetic field can reduce the reversal barrier as it is defined by the magnetic properties of the magnetic tunnel junction cell and of the magnetic field, the magnetic field can increase the effects of the spin torque, and the magnetic field can excite the resonant magnetization motion of the free layer. These effects are appreciated from the following examples.

In the following description, reference is made to the accompanying set of drawings that forms a part hereof and in which are shown by way of illustration several specific embodiments. It is to be understood that other embodiments are contemplated and may be made without departing from the scope or spirit of the present disclosure. The following detailed description, therefore, is not to be taken in a limiting sense. The definitions and descriptions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the specification and attached claims are approximations that can vary depending upon the desired properties sought to be obtained by those skilled in the art utilizing the teachings disclosed herein.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

While the present disclosure is not so limited, an appreciation of various aspects of the disclosure and of the invention will be gained through a discussion of the Figures and the examples provided below.

A magnetic memory unit is illustrated in FIG. 1A as memory unit 1A. Memory unit 1A includes magnetic tunnel junction cell 10. Magnetic tunnel junction cell 10 has a ferromagnetic free layer 12, a nonmagnetic tunnel barrier 14, a ferromagnetic pinned layer 16, and an antiferromagnetic pinning layer 18, arranged with tunnel barrier 14 positioned between free layer 12 and pinned layer 16, and pinning layer 18 proximate pinned layer 16 opposite tunnel barrier 14. In the illustrated orientation, free layer 12 is the top layer of the stack of layers. Tunnel barrier 14 spatially separates free layer 12 from pinned layer 16. Proximate pinning layer 18 is an electrode 20 that electrically connects magnetic tunnel junction cell 10 to control transistor 22.

The ferromagnetic layers for the structure, e.g., free layer 12 and pinned layer 16, can be, but not be limited to, transition metals such as Ni, Co, Fe and their alloys such as NiFe and CoFe. Ternary alloys, such as CoFeB, may be particularly useful because of their lower moment and high polarization ratio, which are desirable for the spin-current switch. Either or both of free layer 12 and pinned layer 16 may be either a single layer or an unbalanced synthetic antiferromagnetic (SAF) coupled structure, i.e., two ferromagnetic sublayers separated by a metallic spacer, such as Ru or Cu, with the magnetization orientations of the sublayers in opposite directions to provide a net magnetization.

Tunnel barrier layer 14 may be a nonmagnetic metallic material or a nonmagnetic metal oxide material; examples of suitable conductive metallic materials include Cu, Ag, and Au, and examples of insulating oxide and semiconductor barriers include AlO, $Al_2O_3$, TiO, and MgO. Tunneling barrier layer 14 could optionally be patterned with free layer 12 or with pinned layer 16, depending on process feasibility and device reliability.

Each of free layer 12 and pinned layer 16 has a magnetic orientation or magnetization orientation associated therewith. Pinned layer 16 is pinned by antiferromagnetic pinning layer 18, or in other embodiments, may be a fixed layer without pinning but with a high coercivity to stabilize itself.

In FIG. 1A, the magnetization orientation of free layer 12, due to spin polarization, is illustrated parallel to the magnetization orientation of pinned layer 16, due to a current being passed through magnetic tunnel junction cell 10 in the direction from free layer 12 to pinned layer 16 (illustrated by the dashed line).

Positioned orthogonal to the possible orientation directions of the magnetization of free layer 12 and pinned layer 16, a current source 25 is provided proximate magnetic tunnel junction cell 10. For memory unit 1A of FIG. 1A, current source 25 is proximate free layer 12. Current source 25 provides a current flow 25A in a direction that generates an ampere field that is in the same direction as that of the spin polarization of free layer 12. Current flow 25A is orthogonal to the current that provides the spin torque; that is, current flow 25A is not parallel to the flow of the spin torque current through free layer 12 and pinned layer 16.

Because the spin polarized free layer magnetization is in same direction as the ampere field, the current ampere field reduces the switching barrier of free layer 12 and magnetic tunnel junction cell 10, and also provides direction preference for the free layer magnetization. Thus the required spin torque switching current is reduced.

If the desired final state of magnetic tunnel junction cell 10 is an antiparallel magnetization configuration between free layer 12 and pinned layer 16, the current for spin torque is applied in the opposite direction, from pinned layer 16 to free layer 12. Simultaneously, the direction of current source 25 is reversed as well.

Figure 1B:
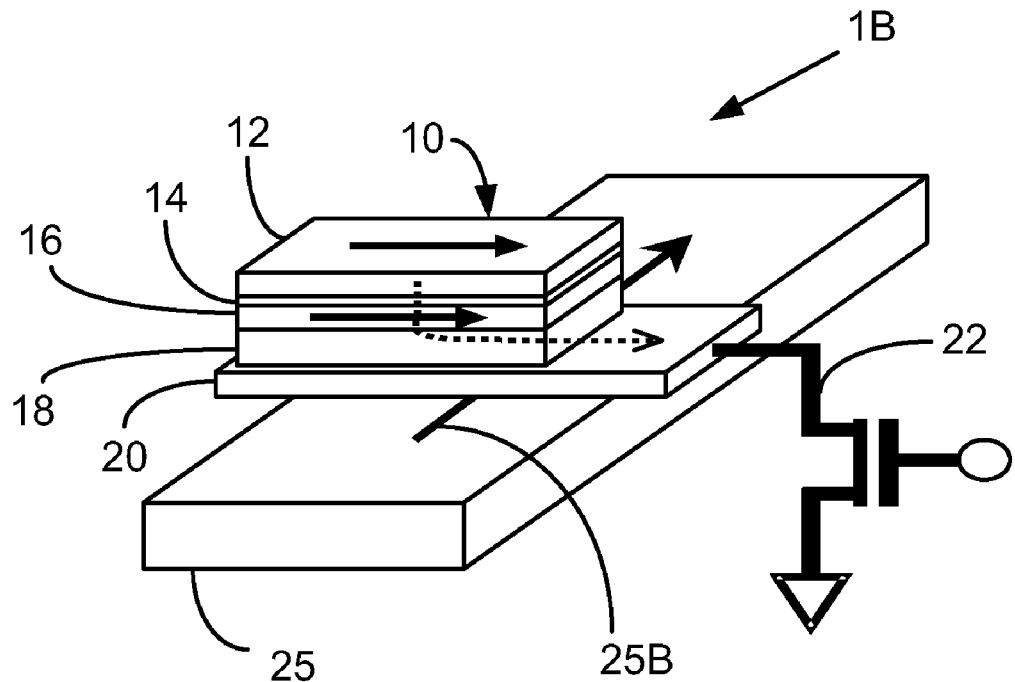
FIG. 1B is a schematic perspective view of the magnetic memory unit with a current applied to the magnetic tunnel junction cell proximate the pinned layer.

FIG. 1B illustrates an alternate embodiment of a memory unit having an ampere magnetic field source positioned orthogonal to the possible orientation directions of the magnetization of free layer 12 and pinned layer 16. In FIG. 1B memory unit 1B is similar to memory unit 1A in that it includes magnetic tunnel junction cell 10 having ferromagnetic free layer 12, nonmagnetic tunnel barrier 14, ferromagnetic pinned layer 16, antiferromagnetic pinning layer 18, and electrode 20. For memory unit 1B, however, current source 25 is proximate electrode 20 and pinned layer 16.

In FIG. 1B, the magnetization orientation of free layer 12, due to spin polarization, is illustrated parallel to the magnetization orientation of pinned layer 16, due to a current being passed through magnetic tunnel junction cell 10 in the direction from free layer 12 to pinned layer 16 (illustrated by the dashed line). Current source 25, positioned below magnetic tunnel junction cell 10, provides a current flow 25B in a direction that generates an ampere field that is in the same direction as that of the spin polarization of free layer 12. Current flow 25B is orthogonal to the current that provides the spin torque; that is, current flow 25B is not parallel to the flow of the spin torque current through free layer 12 and pinned layer 16. If the desired final state of magnetic tunnel junction cell 10 is an antiparallel magnetization configuration between free layer 12 and pinned layer 16, the current for spin torque is applied in the opposite direction, from pinned layer 16 to free layer 12. Simultaneously, the direction of current source 25 is reversed as well.

Figure 2:
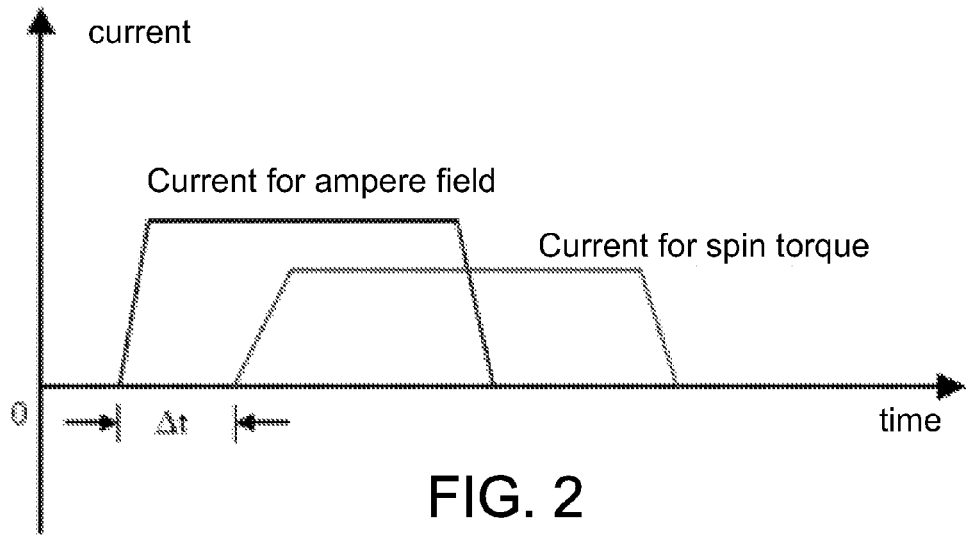
FIG. 2 is a graphical representation of a current pulse sequence for the current for the ampere field and the current for the spin torque.

Both the current in current source 25 for generating the ampere field and the current passing through magnetic tunnel junction cell for inducing spin torque are in the form of pulses. One exemplary pulse sequence is shown in FIG. 2 with the ampere field current leading the spin torque current by a certain amount of time, which is predetermined in order to optimize the magnetization switching in terms of switching speed and power consumption. In some embodiments, the pulse for the ampere field current may be longer than the spin torque current by at least a period of $\Delta t$, so that the ampere field current is turned off after the spin torque current is. In the illustrated example, the amplitude of the ampere field current is greater than the spin torque current amplitude.

Figure 3A:
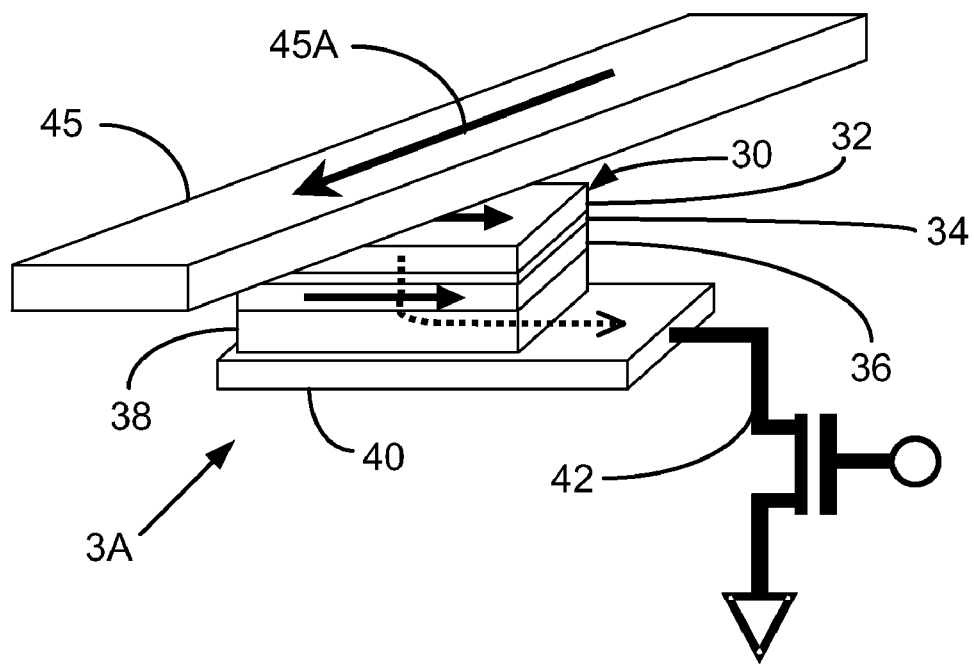
FIG. 3A is a schematic perspective view of a second embodiment of a magnetic memory unit with a current applied to the magnetic tunnel junction cell proximate the free layer, the current applied angled to the free layer magnetization orientation direction.
Figure 3B:
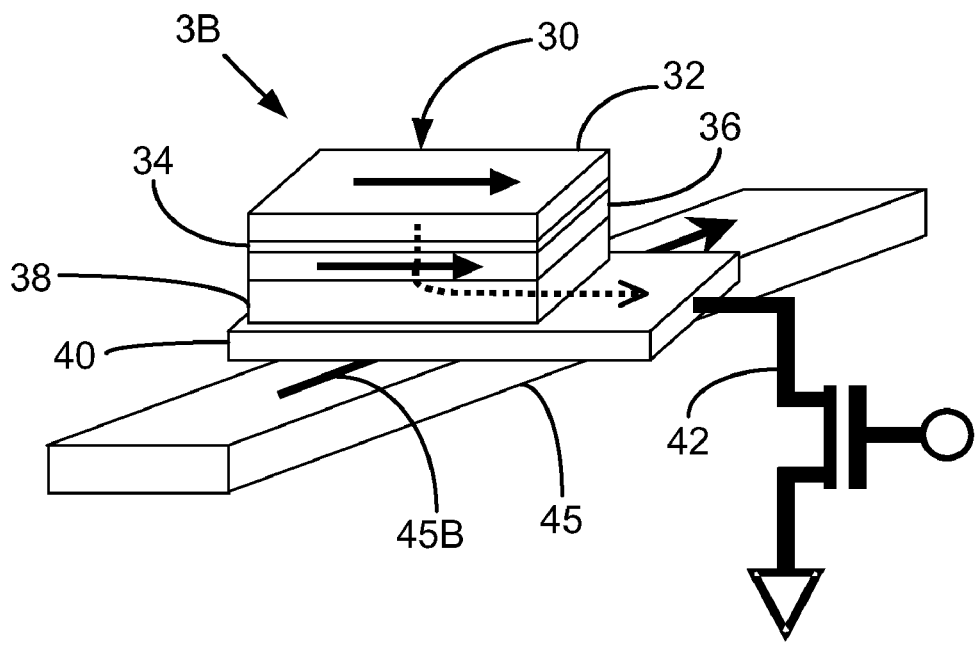
FIG. 3B is a schematic perspective view of the magnetic memory unit with a current applied to the magnetic tunnel junction cell proximate the pinned layer.

Another design of memory units having a magnetic tunnel junction cell and an external ampere magnetic field source is illustrated in FIGS. 3A and 3B. In these embodiments, the ampere magnetic field source is positioned at an angle other than orthogonal to or parallel to the possible orientation directions of the magnetization of the free layer and the pinned layer.

A magnetic memory unit is illustrated in FIG. 3A as memory unit 3A. The various elements of memory unit 3A are similar to and have the same or similar properties and features as the corresponding elements of memory units 1A, 1B, unless indicated otherwise. Memory unit 3A includes magnetic tunnel junction cell 30 having a ferromagnetic free layer 32, a nonmagnetic tunnel barrier 34, a ferromagnetic pinned layer 36, and an antiferromagnetic pinning layer 38. In the illustrated orientation, free layer 32 is the top layer of the stack of layers. Each of free layer 32 and pinned layer 36 has a magnetic orientation or magnetization orientation associated therewith. Proximate pinning layer 38 is an electrode 40 that electrically connects magnetic tunnel junction cell 30 to control transistor 42.

In FIG. 3A, the magnetization orientation of free layer 32, due to spin polarization, is illustrated parallel to the magnetization orientation of pinned layer 36, due to a current being passed through magnetic tunnel junction cell 30 in the direction from free layer 32 to pinned layer 36 (illustrated by the dashed line).

Positioned at an angle to the possible orientation directions of the magnetization of free layer 32 and pinned layer 36, a current source 45 is provided proximate magnetic tunnel junction cell 30. For memory unit 3A of FIG. 3A, current source 45 is proximate free layer 32 and provides a current flow 45A in a direction that generates an ampere field that has some angle (other than parallel to or orthogonal/perpendicular) to that of the spin polarization of free layer 32. Current flow 45A is not parallel to the flow of the spin torque current through free layer 32 and pinned layer 36. Because of the angled magnetic field from current source 45, the free layer magnetization rotates to an equilibrium direction not aligned to the spin polarization direction. The angle between the free layer magnetization and spin polarization direction facilitates spin torque switching. The current ampere field reduces the switching barrier of free layer 32 and of magnetic tunnel junction cell 30, and also provides direction preference for the free layer magnetization. Thus the required spin torque switching current is reduced.

If the desired final state of magnetic tunnel junction cell 30 is an antiparallel magnetization configuration between free layer 32 and pinned layer 36, the current for spin torque is applied in the opposite direction, from pinned layer 36 to free layer 32. Simultaneously, the direction of current source 45 is reversed as well.

FIG. 3B illustrates an alternate embodiment of a memory unit having an ampere magnetic field source positioned at an angle to the possible orientation directions of the magnetization of free layer 12 and pinned layer 16. In FIG. 1B memory unit 1B is similar to memory unit 1A in that it includes magnetic tunnel junction cell 10 having ferromagnetic free layer 12, nonmagnetic tunnel barrier 14, ferromagnetic pinned layer 16, antiferromagnetic pinning layer 18, and electrode 20. For memory unit 1B, however, current source 25 is proximate electrode 20 and pinned layer 16.

In FIG. 3B, the magnetization orientation of free layer 32, due to spin polarization, is illustrated parallel to the magnetization orientation of pinned layer 36, due to a current being passed through magnetic tunnel junction cell 30 in the direction from free layer 32 to pinned layer 36 (illustrated by the dashed line). Current source 45, positioned below magnetic tunnel junction cell 30, provides a current flow 45B in a direction that generates an ampere field that has some angle (other than parallel to or orthogonal/perpendicular) to that of the spin polarization of free layer 32. If the desired final state of magnetic tunnel junction cell 30 is an antiparallel magnetization configuration between free layer 32 and pinned layer 36, the current for spin torque is applied in the opposite direction, from pinned layer 36 to free layer 32. Simultaneously, the direction of current source 45 is reversed as well.

Due to the tilted or angled magnetic field from current source 45, as illustrated in FIGS. 3A and 3B, the free layer magnetization rotates to an equilibrium direction not aligned with the spin polarization direction. The angle between the free layer magnetization and spin polarization direction facilitates spin torque switching, because the spin torque magnitude is proportional to the cross product of magnetization and spin polarization, and, is thus increased in this design. The angle between current direction 45A, 45B and the free layer spin torque magnetization orientation direction is between 0 degrees and 90 degrees, exclusive of 0 and 90. In some embodiments, the angle may be reported based on a total of 360 degrees. No matter how reported, the current source and resulting current direction is not orthogonal or perpendicular to the possible magnetization orientation directions nor is it parallel to the possible magnetization orientation directions. In some embodiments, the current source is off from parallel and perpendicular to the magnetization orientation direction by at least 15 degrees; this provides an angle of about 15 degrees to about 75 degrees between the current source and magnetization direction. In some other embodiments, the current source is off from parallel and perpendicular to the magnetization orientation direction by at least 30 degrees; this provides an angle of about 30 degrees to about 60 degrees between the current source and magnetization direction. The amplitude and direction of the current will affect the optimal angle from the magnetization direction.

Figure 4:
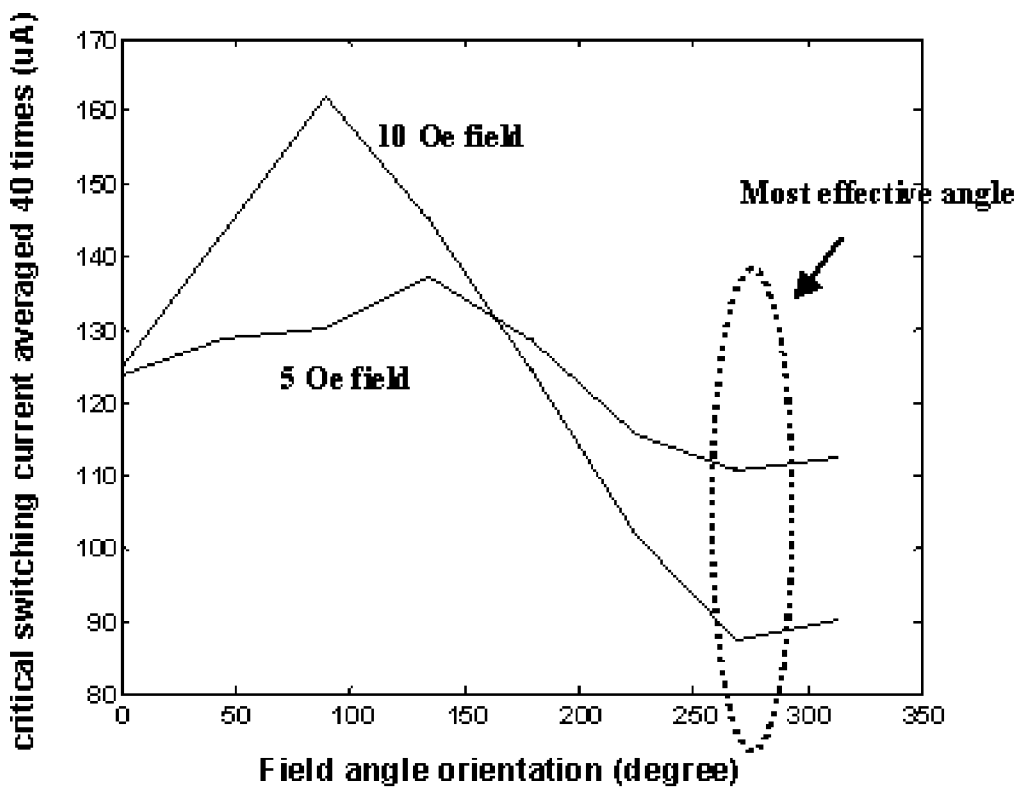
FIG. 4 is a graphical representation of experimental measurement of spin current reduction as a function of angular orientation of a magnetic field.

FIG. 4 provides a graphical representation of the experimental results of effects of an external magnetic field and its angle on spin torque switching of a magnetic tunnel junction cell. In FIG. 4, the affects of a 10 Oersted (Oe) and a 5 Oe magnetic field at different angles are illustrated. A reduction of at least 30% (from about 160 microAmps to about 90 microAmps) of switching current was calculated due to the addition of a 10 oersted (Oe) DC magnetic field. To most effectively assist spin torque magnetization reversal, the direction of the magnetic field was about 250 to about 300 degrees (on a 360 degree basis), or, about 20-30 degrees from perpendicular. A magnetic field in magnitude of 10 Oe can be provided for a wire of 100 nm with current density $10^7$ A/cm$^2$. Also shown in FIG. 4, a reduction of about 20% (from about 135 microAmps to about 110 microAmps) of switching current was calculated due to the addition of a 5 Oe DC magnetic field. In some embodiments, it is believed that a reduction of at least about 50% may be attainable, depending on the specific configuration and construction of the magnetic tunnel junction cell and its layers and the voltage, amperage and duration of the applied currents.

Figure 5A:
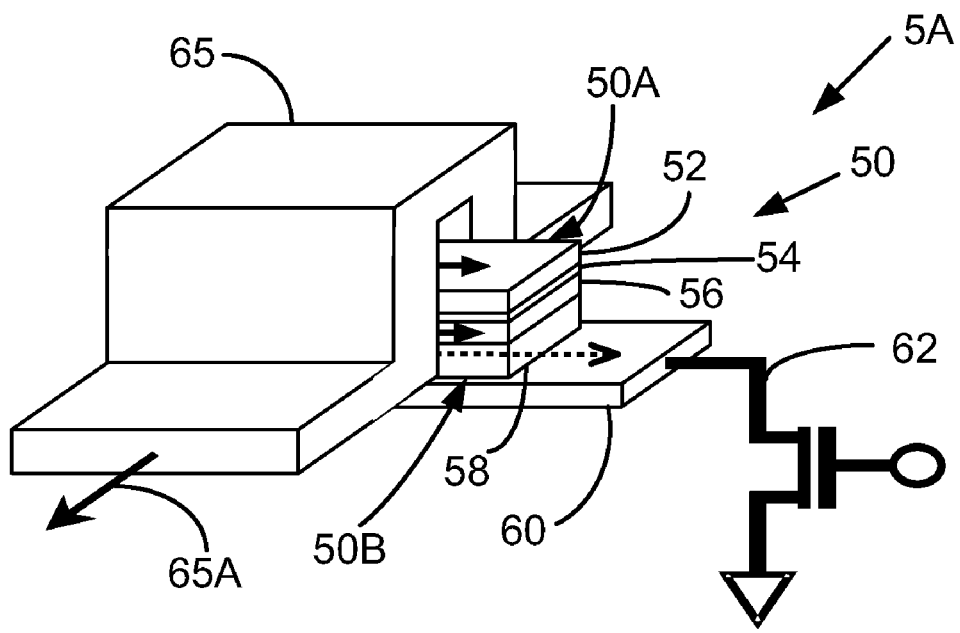
FIG. 5A is a schematic perspective view of a third embodiment of a magnetic memory unit with a current applied to the magnetic tunnel junction cell proximate the free layer.
Figure 5B:
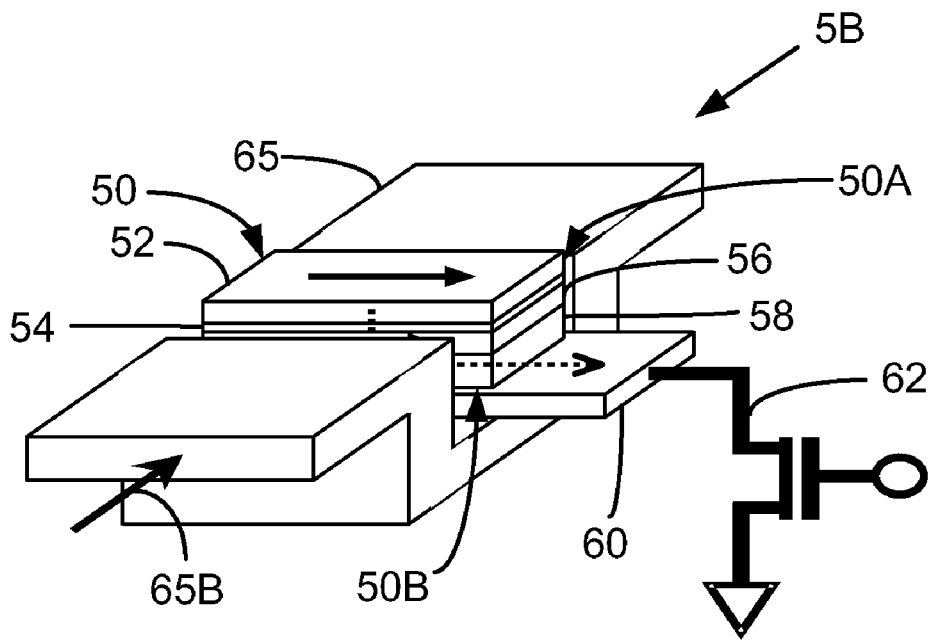
FIG. 5B is a schematic perspective view of the magnetic memory unit with a current applied to the magnetic tunnel junction cell proximate the pinned layer.

Another design of memory units having a magnetic tunnel junction cell and an external ampere magnetic field source is illustrated in FIGS. 5A and 5B. The various elements of the memory units of FIGS. 5A and 5B are similar to and have the same or similar properties and features as the corresponding elements of previously described memory units unless indicated otherwise. In these embodiments, the ampere magnetic field source is proximate the free layer on two opposite or opposing sides of the free layer. In some embodiment, the ampere magnetic field source is proximate both the free layer and the pinned layer on two, opposite sides. The ampere magnetic field source may wrap around the magnetic tunnel junction cell, providing an increased exposure to the various layer side faces and providing an increased ampere field. Additionally in these embodiments of FIGS. 5A and 5B, the ampere magnetic field source has multiple current direction vectors.

A magnetic memory unit is illustrated in FIG. 5A as memory unit 5A. Memory unit 5A includes magnetic tunnel junction cell 50 having a ferromagnetic free layer 52, a nonmagnetic tunnel barrier 54, a ferromagnetic pinned layer 56, and an antiferromagnetic pinning layer 58. Magnetic tunnel junction cell 50 has a first side 50A and a second side 50B opposite side 50A. In the illustrated orientation, free layer 52 is the top layer of the stack of layers. Each of free layer 52 and pinned layer 56 has a magnetic orientation or magnetization orientation associated therewith. Proximate pinning layer 58 is an electrode 60 that electrically connects magnetic tunnel junction cell 50 to a control transistor 62.

In FIG. 5A, the magnetization orientation of free layer 52, due to spin polarization, is illustrated parallel to the magnetization orientation of pinned layer 56, due to a current being passed through magnetic tunnel junction cell 50 in the direction from free layer 52 to pinned layer 56 and out via electrode 60 (partially illustrated by the dashed line).

Positioned orthogonal to the possible orientation directions of the magnetization of free layer 52 and pinned layer 56, a current source 65 is provided proximate magnetic tunnel junction cell 50. For memory unit 5A of FIG. 5A, current source 65 is proximate both free layer 52 and pinned layer 56 and wraps around magnetic tunnel junction cell 50 from side 50A, around free layer 52 to side 50B. Current source 65 provides an overall current flow 65A in a direction that generates an ampere field that is in the same direction as that of the spin polarization of free layer 52. Current flow 65A is not parallel to the flow of the spin torque current through free layer 52 and pinned layer 56; current flow 65A is orthogonal to spin torque magnetization orientation of free layer 52 and pinned layer 56. In some embodiments, current source 65 may be clad with a high permeable magnetic material, to concentrate the magnetic flux in the cladding and thus enhance the field at the open face proximate the layers of magnetic tunnel junction cell 50.

Because the spin polarized free layer magnetization is in same direction as the ampere field, the current ampere field reduces the switching barrier of free layer 52 and of magnetic tunnel junction cell 50, and also provides direction preference for the free layer magnetization. Thus the required spin torque switching current is reduced.

If the desired final state of magnetic tunnel junction cell 50 is an antiparallel magnetization configuration between free layer 52 and pinned layer 56, the current for spin torque is applied in the opposite direction, from pinned layer 56 to free layer 52. Simultaneously, the direction of current source 65 is reversed as well.

FIG. 5B illustrates an alternate embodiment of a memory unit having an ampere magnetic field source positioned proximate both free layer 52 and pinned layer 56. In FIG. 5B memory unit 5B is similar to memory unit 5A in that it includes magnetic tunnel junction cell 50 with sides 50A, 50B and having ferromagnetic free layer 52, nonmagnetic tunnel barrier 54, ferromagnetic pinned layer 56, antiferromagnetic pinning layer 58, and electrode 60. For memory unit 5B, however, current source 65 wraps around magnetic tunnel junction cell 50 from side 50B, around electrode 60 and pinned layer 56, to side 50A.

In FIG. 5B, the magnetization orientation of free layer 52, due to spin polarization, is illustrated parallel to the magnetization orientation of pinned layer 56, due to a current being passed through magnetic tunnel junction cell 50 in the direction from free layer 52 to pinned layer 56 (illustrated by the dashed line). Current source 65, wrapped around magnetic tunnel junction cell 50 at electrode 60, provides a current flow 65B in a direction that generates an ampere field that is in the same direction as that of the spin polarization of free layer 52. If the desired final state of magnetic tunnel junction cell 50 is an antiparallel magnetization configuration between free layer 52 and pinned layer 56, the current for spin torque is applied in the opposite direction, from pinned layer 56 to free layer 52. Simultaneously, the direction of current source 65 is reversed as well.

Providing the ampere field current source 65 wrapped around magnetic tunnel junction cell 50, particularly around layers 52, 56, results in an increased ampere field affect, as compared to other embodiments, such as those in FIGS. 1A and 1B and FIGS. 3A and 3B. It is noted that the current source 65 could be orthogonal to the magnetization orientation direction (as in the embodiments of FIGS. 1A and 1B) or angled (as in the embodiments of FIGS. 3A and 3B).

Figure 6:
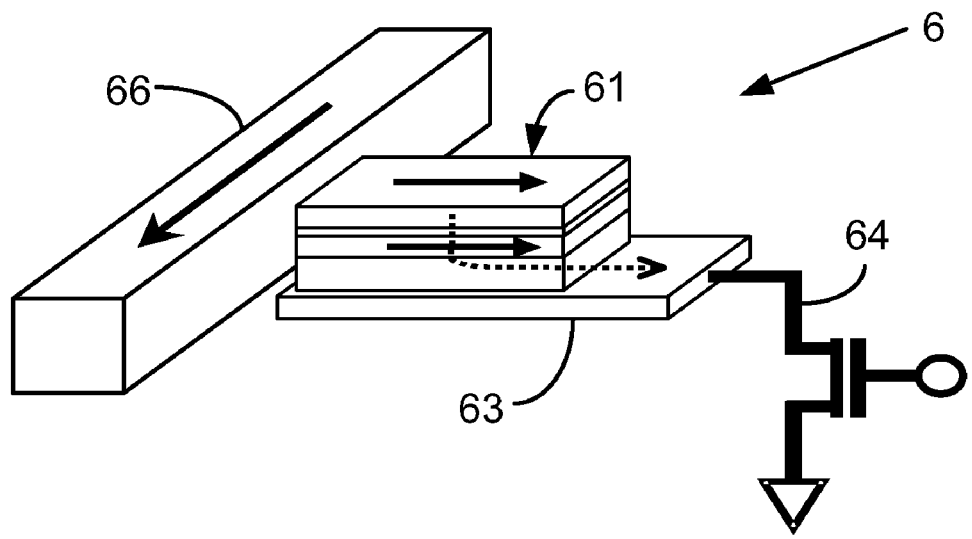
FIG. 6 is a schematic perspective view of a fourth embodiment of a magnetic memory unit with a current applied to the magnetic tunnel junction cell proximate both the free layer and the pinned layer, the current applied generally planar to the magnetic tunnel junction cell and proximate both the free layer and the pinned layer.
Figure 7:
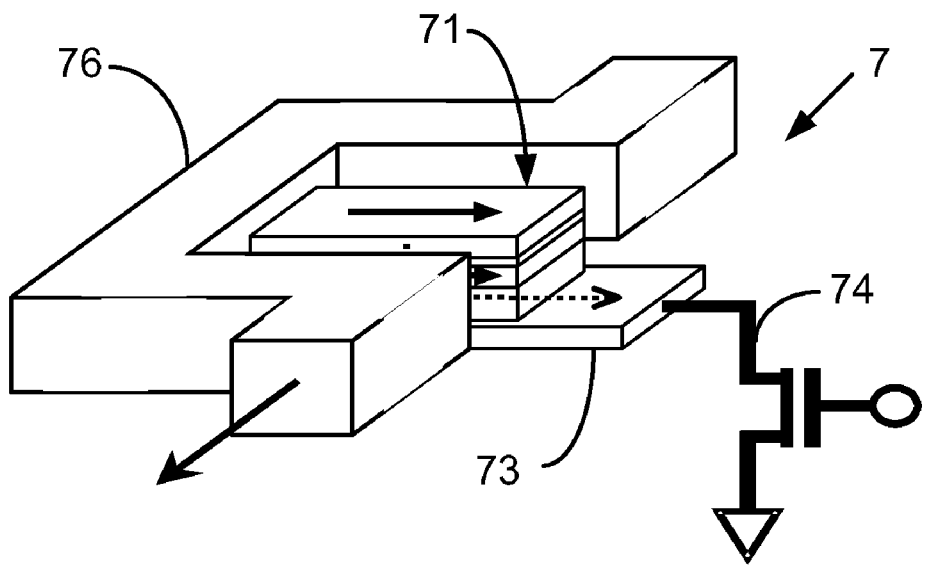
FIG. 7 is a schematic perspective view of a fifth embodiment of a magnetic memory unit with a current applied generally planar to the magnetic tunnel junction cell and proximate both the free layer and the pinned layer.

In the previous various designs, the current source for the magnetic ampere field was positioned above or below at least a portion of the magnetic tunnel junction cell and the connected electrode. Another design of memory units having a magnetic tunnel junction cell and an external ampere magnetic field source is illustrated in FIGS. 6 and 7. The various elements of the memory units of FIGS. 6 and 7 are similar to and have the same or similar properties and features as the corresponding elements of previously described memory units unless indicated otherwise. In these embodiments, the ampere magnetic field source is positioned to a side of the magnetic tunnel junction cell, proximate the free layer and the pinned layer, and in the generally same plane. The ampere field generated by the current source is perpendicular to the cell stack plane. This ampere field, even against the demagnetizing field on the free layer, can help the magnetization switching under spin torque.

FIGS. 6 and 7 show two configurations for a design with a straight current wire (FIG. 6) and a wound current wire wrapping the magnetic tunnel junction cell for ampere field enhancement (FIG. 7), both in the plane of the magnetic tunnel junction cell. Specifically, FIG. 6 shows a memory unit 6 that has a magnetic tunnel junction cell 61 with an adjacent electrode 63 connected to transistor 64. Current source 66 extends in the plane of magnetic tunnel junction cell 61 proximate a single side of magnetic tunnel junction cell 61. FIG. 7 shows a memory unit 7 that has a magnetic tunnel junction cell 71 with an adjacent electrode 73 connected to transistor 74. Current source 76 extends in the plane of magnetic tunnel junction cell 71 wrapping around magnetic tunnel junction cell 71 and proximate three sides. In both of these illustrated embodiments, magnetic tunnel junction cells 61, 71 have a parallel magnetization orientation due to a current that provides spin torque. When the magnetization is needed to switch to antiparallel, the current for the spin torque is applied in the opposite direction. However, unlike in the previous embodiments, the current of the wire for ampere field does not need to change direction. Therefore, these embodiments have a unipolar mode of ampere field assist.

Although various specified examples of magnetic tunnel junction cells and memory units have been illustrated and described, it is understood that variations of both are within the scope of this disclosure. For example, the magnetic tunnel junction cells have been illustrated as rectangular in shape; these may be other shapes, such as, for example, round, elliptical, or square. Each of the previous embodiments have provided the free layer physically oriented above the pinned layer; the magnetic tunnel junction cell could be oriented otherwise, so that the pinned layer is on top of or above the free layer. The electrode and transistor have been electrically connected through the pinning layer in the previous embodiments; the electrode and transistor could be connected otherwise. Additionally, the spin torque current path through the electrode and transistor has been illustrated as turning at a right angle (perpendicular) to the direction of input of the spin torque; in alternate embodiments, the current path may continued in the same direction rather than bending.

To create magnetic memory units such as those illustrated as memory units 1A, 1B, 3A, 3B, 5A, 5B, etc., the magnetic tunnel junction cell 10, 30, 50 etc. can made using well-known thin film techniques (e.g., chemical vapor deposition (CVD), physical vapor deposition (PVD), atomic layer deposition (ALD), photolithography, or other thin film processing techniques to sequentially form the layers. The magnetization orientations of the pinned layer may be set immediately after forming the pinned layer or after forming subsequent layer(s). A magnetic ampere field current source 25, 45, 65, etc. can be subsequently connected to the magnetic tunnel junction cell. The ampere field current source may be formed using well-known thin film techniques or may be previously formed and connected to the cell.

Figure 8:
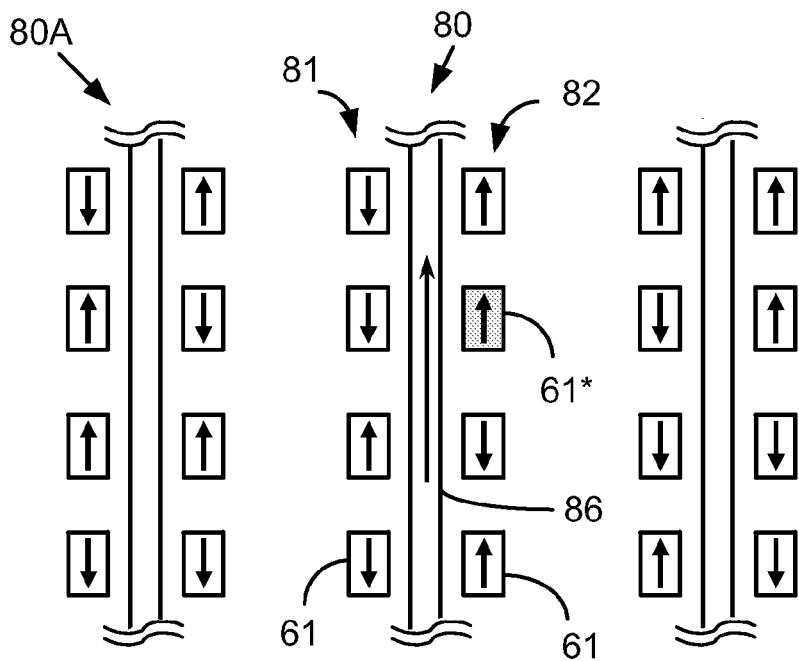
FIG. 8 is a schematic top view of an array of magnetic memory units arranged as two rows of units sharing a current wire.
Figure 9:
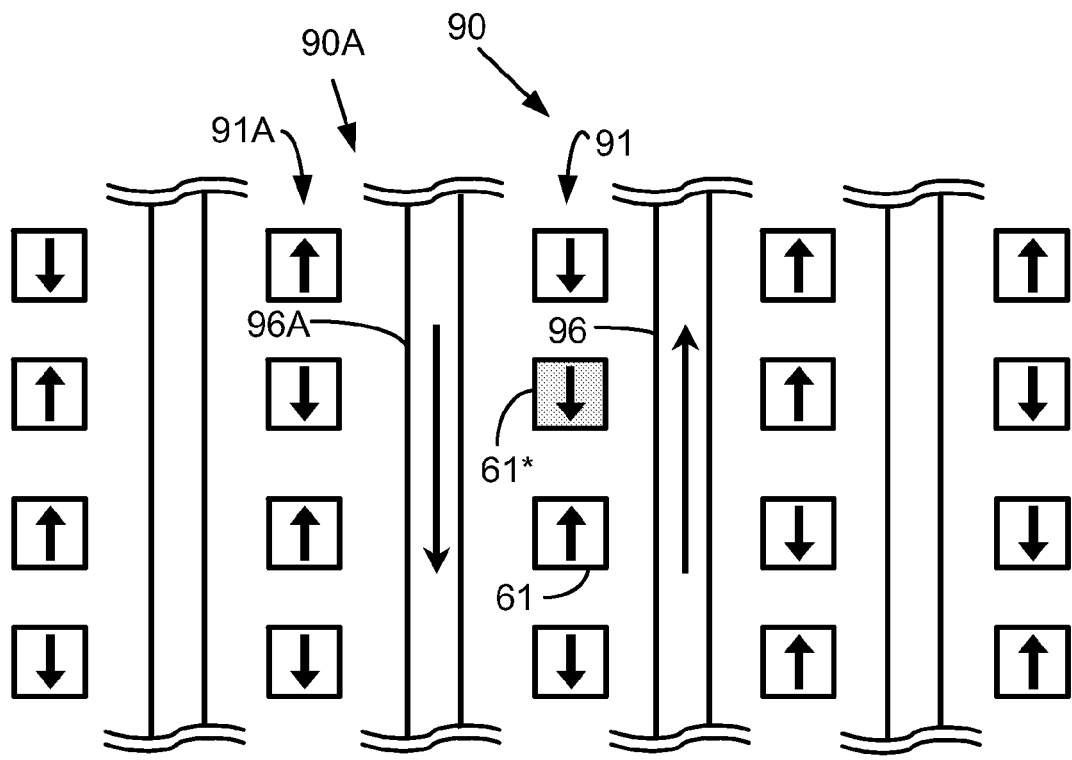
FIG. 9 is a schematic top view of an array of magnetic memory units arranged as a plurality of rows with a current wire between each row.

The various magnetic tunnel junction cells described above and others according to this disclosure can be incorporated into arrays, forming spin-transfer torque memory or STRAM. Using the in-plane current wire design of memory unit 61 of FIG. 6 as an example, a memory array 80 can be arranged to have two rows 81, 82 of memory units 61 sharing a single (e.g., central) current wire 86, as illustrated in FIG. 8. The memory cell 61* selected for writing is shaded. The area between two adjacent memory unit arrays 80, 80A (i.e., the area between unit rows without a current wire) can be either wider or narrower than the area within the array having the current wire, depending upon design consideration. Another example, using the in-plane current wire design of memory unit 61 of FIG. 6, a memory array 90, 90A can be arranged to have a current wire 96, 96A for each row 91, 91A of memory units, as illustrated in FIG. 9. In this configuration, when a memory cell 61 (e.g., the shaded memory cell 61*) is selected for writing, wires 96, 96A on both sides of memory cell 61* are activated (e.g., turned on). The two current flows and two ampere fields add up together on memory cell 61* to assist switching. When using two current flows for one memory cell row, the direction of the two currents must be opposite to each other.

Figure 10:
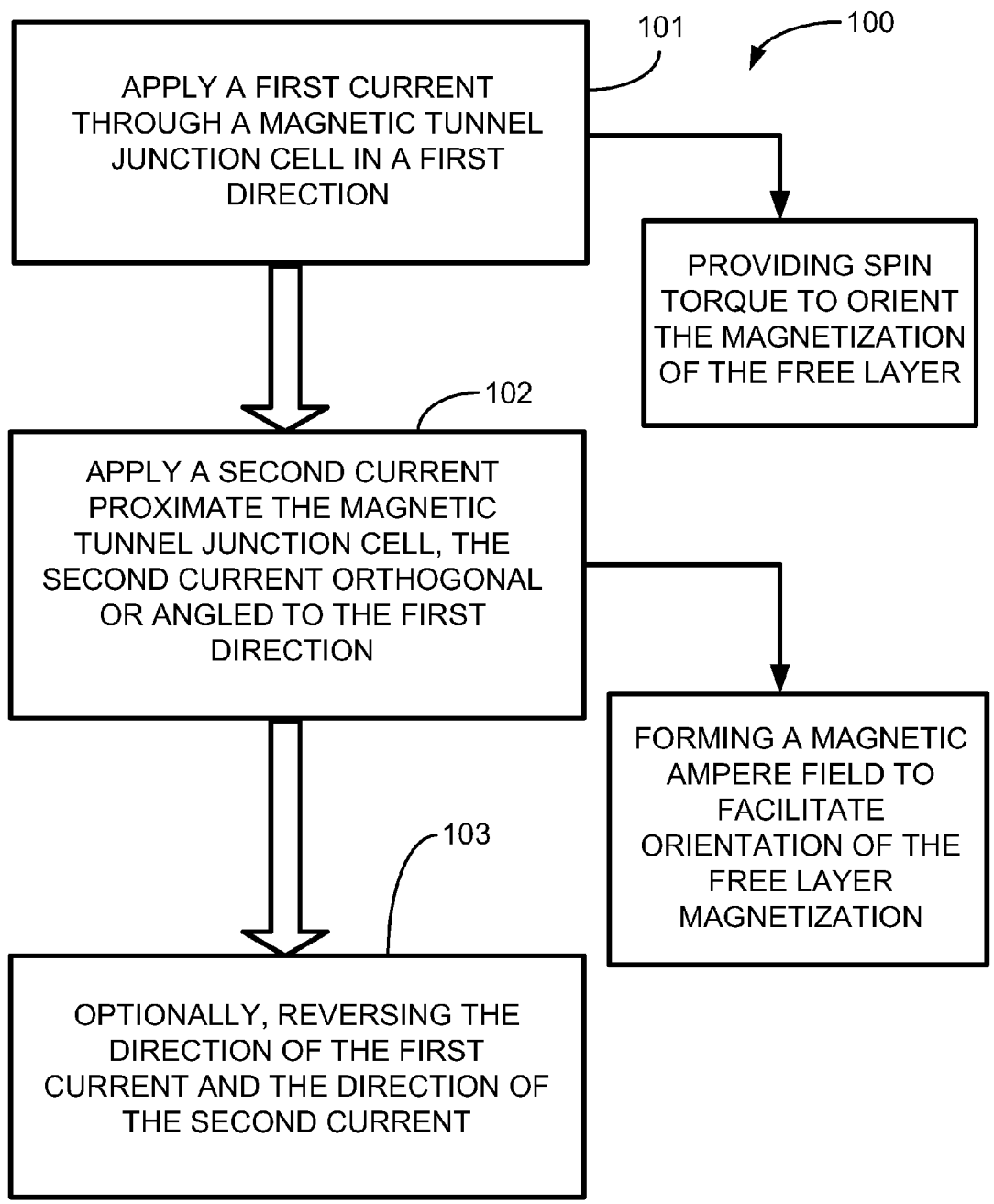
FIG. 10 is a flow diagram of a method of programming a magnetic memory unit.

A general method for writing to a memory unit, such as those described above, is illustrated in FIG. 10 as process 100. In a first step 101, a first current is applied through the magnetic tunnel junction cell from a current source via the electrode and control transistor. This current provides the spin torque to orient the magnetization of the free layer of the tunnel junction cell. In a second step 102, second current is applied proximate the magnetic tunnel junction cell from a second current source. This second current may be orthogonal to or at and angle to the magnetization of free layer of the junction cell. Various specific directions and orientations of this second current have been illustrated and described above. This second current forms a magnetic ampere field that facilitates orientation of the free layer magnetization, thus reducing the first current needed to orient the magnetization. A suitable amplitude for the second current is, for example, about 10-25 Amps. To switch the magnetization orientation of the free layer, in a step 103, the direction of the first current and the direction of the second current are reversed.

Both the first current and the second current may be pulsed; the pulses may have different amplitudes and/or different durations. In some embodiments, the second current pulse initiates before the first current pulse initiates. Additionally or alternately, the first current pulse terminates before the second current pulse terminates. By inclusion of the second current, the amplitude of the first current may be reduced or the pulse duration may be reduced. The overall duration and amplitude of the two currents is less than if only one current were used to switch the magnetization orientation of the free layer.

Thus, embodiments of the MAGNETIC FIELD ASSISTED STRAM CELLS are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present invention is limited only by the claims that follow.

What is claimed is:

1. A memory unit comprising:
   a magnetic tunnel junction cell comprising a ferromagnetic pinned layer, a ferromagnetic free layer, and a non-magnetic barrier layer therebetween, the pinned layer and the free layer each having possible magnetization orientations;
   a spin torque current source for passing a current through the magnetic tunnel junction cell; and
   a magnetic ampere field current source positioned orthogonal to the possible magnetization orientations of the free layer and the pinned layer,
   wherein the magnetic ampere field current source is orthogonal to the spin torque current source.

2. The memory unit of claim 1, wherein the magnetic ampere field current source is oriented in a direction angled to the spin torque current source direction.

3. The memory unit of claim 2, wherein the magnetic ampere field current source is oriented not parallel and not perpendicular to the spin torque current source direction.

4. The memory unit of claim 2, wherein the magnetic ampere field current source is oriented at an angle of about 15 degrees to about 75 to the spin torque current source direction.

5. The memory unit of claim 2, wherein the magnetic ampere field current source is oriented at an angle of about 30 degrees to about 60 to the spin torque current source direction.

6. The memory unit of claim 1, wherein the magnetic ampere field current source is proximate to at least the pinned layer of the magnetic tunnel junction cell.

7. The memory unit of claim 1, wherein the magnetic ampere field current source is proximate both the free layer and the pinned layer of the magnetic tunnel junction cell.

8. The memory unit of claim 1, wherein the magnetic ampere field current source has am amplitude from about 10 to 25 Amps.

9. A memory unit comprising:
   a magnetic tunnel junction cell comprising a ferromagnetic pinned layer, a ferromagnetic free layer, and a non-magnetic barrier layer therebetween, the pinned layer and the free layer each having possible magnetization orientations;
   a spin torque current source; and
   a magnetic ampere field current source,
   wherein the combination of the spin torque current source and the magnetic ampere field current source can switch the magnetization of the free layer.

10. The memory unit of claim 9, wherein the magnetic ampere field current source is oriented in a direction orthogonal to the possible magnetization orientations.

11. The memory unit of claim 10, wherein the magnetic ampere field current source is oriented in a direction orthogonal to the spin torque current source direction.

12. The memory unit of claim 11, wherein the magnetic ampere field current source is oriented in a direction angled to the spin torque current source direction.

13. The memory unit of claim 12, wherein the magnetic ampere field current source is oriented not parallel and not perpendicular to the spin torque current source direction.

14. The memory unit of claim 12, wherein the magnetic ampere field current source is oriented at an angle of about 15 degrees to about 75 degrees to the spin torque current source direction.

15. The memory unit of claim 9, wherein the magnetic ampere field current source is proximate to at least the pinned layer of the magnetic tunnel junction cell.

16. The memory unit of claim 9, wherein the magnetic ampere field current source is proximate to at least the pinned layer of the magnetic tunnel junction cell.

17. The memory unit of claim 9, wherein the magnetic ampere field current source is proximate both the free layer and the pinned layer of the magnetic tunnel junction cell.

18. A memory unit comprising:
    a magnetic tunnel junction cell comprising a ferromagnetic pinned layer, a ferromagnetic free layer, and a non-magnetic barrier layer therebetween, the pinned layer and the free layer each having possible magnetization orientations;
    a spin torque current source for passing a current through the magnetic tunnel junction cell; and
    a magnetic ampere field current source positioned orthogonal to the possible magnetization orientations of the free layer and the pinned layer,
    wherein the magnetic ampere field current source is orthogonal to the spin torque current source, and wherein the combination of the spin torque current source and the magnetic ampere field current source can switch the magnetization of the free layer.

19. The memory unit of claim 18, wherein the magnetic ampere field current source is oriented in a direction angled to the spin torque current source direction.

20. The memory unit of claim 18, wherein the magnetic ampere field current source is oriented at an angle of about 30 degrees to about 60 degrees to the spin torque current source direction.

* * * * *